(12) United States Patent
Dixon et al.

(10) Patent No.: US 7,297,021 B1
(45) Date of Patent: Nov. 20, 2007

(54) DEVICES, SYSTEMS, AND METHODS FOR BYPASSING AN ELECTRICAL METER

(75) Inventors: Joseph Scott Dixon, Suwanee, GA (US); Kristopher Scott Robinson, Atlanta, GA (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 0 days.

(21) Appl. No.: 11/468,823

(22) Filed: Aug. 31, 2006

(51) Int. Cl.
*H01R 33/945* (2006.01)
(52) U.S. Cl. ...................................... 439/517; 200/244
(58) Field of Classification Search ................ 439/517, 439/508; 200/244, 570, 571, 554, 553, 560, 200/562
See application file for complete search history.

(56) References Cited

U.S. PATENT DOCUMENTS

| | | | | |
|---|---|---|---|---|
| 3,202,775 A | * | 8/1965 | Tillson ........................ 200/6 R |
| 3,632,935 A | * | 1/1972 | Stegmaier .................... 200/571 |
| 3,917,920 A | * | 11/1975 | Pekrul et al. ................ 200/571 |
| 4,388,670 A | | 6/1983 | Billhartz |
| 4,675,481 A | * | 6/1987 | Markowski et al. ........... 218/1 |
| 4,778,961 A | * | 10/1988 | M'Sadoques et al. ..... 200/17 R |
| 5,006,076 A | | 4/1991 | Robinson |
| 5,030,804 A | * | 7/1991 | Abri ........................... 200/323 |
| 5,145,403 A | * | 9/1992 | Schaffert et al. ............. 439/508 |
| 5,310,971 A | * | 5/1994 | Vial et al. .................... 200/244 |
| 5,357,066 A | * | 10/1994 | Morel et al. ............... 200/17 R |
| 5,775,942 A | * | 7/1998 | Jeffcoat ....................... 439/517 |
| 5,834,932 A | * | 11/1998 | May ............................. 324/107 |
| 5,945,650 A | * | 8/1999 | Holland et al. ................. 218/1 |
| 5,969,308 A | * | 10/1999 | Pever ........................... 200/15 |
| 5,990,439 A | * | 11/1999 | Pever .......................... 218/156 |
| 6,114,641 A | * | 9/2000 | Castonguay et al. ......... 200/244 |
| 6,259,048 B1 | * | 7/2001 | Castonguay et al. ........ 200/244 |
| 6,262,642 B1 | * | 7/2001 | Bauer ........................... 335/16 |
| 6,281,461 B1 | * | 8/2001 | Doughty ..................... 218/154 |
| 6,310,307 B1 | * | 10/2001 | Ciarcia et al. ............... 200/244 |
| 6,313,425 B1 | * | 11/2001 | Doughty et al. ............. 218/149 |
| 6,326,868 B1 | * | 12/2001 | Kranz et al. .................... 335/8 |
| 6,366,438 B1 | * | 4/2002 | Bauer .......................... 361/115 |
| 6,396,369 B1 | * | 5/2002 | Schlitz et al. .................. 335/16 |
| 6,403,901 B1 | * | 6/2002 | Boeder et al. ............... 200/244 |
| 6,403,909 B1 | * | 6/2002 | Green et al. .................. 218/22 |
| 6,426,688 B1 | * | 7/2002 | DeVizzi et al. ................ 335/16 |
| 6,590,173 B2 | * | 7/2003 | Uchida et al. ............... 200/244 |
| 6,639,168 B1 | * | 10/2003 | Castonguay et al. .......... 218/22 |
| 6,791,440 B2 | * | 9/2004 | Harmon et al. ................ 335/16 |
| 6,846,199 B1 | | 1/2005 | Robinson |
| 6,921,290 B1 | * | 7/2005 | Kellerman .................. 439/517 |
| 6,945,813 B1 | * | 9/2005 | Kellerman .................. 439/517 |
| 6,960,731 B2 | * | 11/2005 | Azzola et al. ............... 200/244 |
| 6,965,292 B2 | * | 11/2005 | Ciarcia et al. ................ 337/50 |
| 7,005,594 B2 | * | 2/2006 | Kim ........................... 200/244 |
| 7,040,921 B2 | | 5/2006 | Kellerman |
| 7,116,194 B2 | * | 10/2006 | Azzola et al. ............... 335/202 |
| 7,142,412 B2 | * | 11/2006 | Witherbee et al. ........... 361/662 |
| 7,148,775 B2 | * | 12/2006 | Park ............................ 335/16 |
| 7,189,935 B1 | * | 3/2007 | Hassan et al. ............... 200/244 |
| 2005/0227532 A1 | | 10/2005 | Kellerman |
| 2005/0239325 A1 | | 10/2005 | Cook |

* cited by examiner

*Primary Examiner*—Ross Gushi

(57) ABSTRACT

Certain exemplary embodiments comprise a system, which can comprise a bypass hub for an electrical meter. The bypass hub can comprise an electrically conductive blade comprising a first socket engageable end and a second socket engageable end. The electrically conductive blade can define a through-hole. The electrically conductive blade can be coupled to a shaft via at least one blade retainer.

20 Claims, 19 Drawing Sheets

3000

4000

4100

4200

13000

16000

SEE DETAIL C

17000

19000

SECTION B-B

21000

DETAIL C

DEVICES, SYSTEMS, AND METHODS FOR BYPASSING AN ELECTRICAL METER

BACKGROUND

United States Patent Application No. 20050239325 (Cook), which is incorporated by reference herein in its entirety, allegedly recites that a "modular meter socket is releasably mountable in a housing. Support clips are disposed in the housing by fixing a mounting plate carrying the clips in the enclosure. A mounting panel fixedly carries the meter socket and is attached to the clips without the use of tools operative fasteners or additional fasteners. Alternately, a meter socket and a bypass device are unitarily mounted on a mounting panel for attachment to the clips in the housing. The meter socket and the bypass device may be mounted on separate panels, each attached to the clips in the housing without additional fasteners." See Abstract.

U.S. Pat. No. 4,388,670 (Billhartz), which is incorporated by reference herein in its entirety, allegedly recites that a "watthour meter socket assembly of the type which engages the blades of a watthour meter. The blades are frictionally held by pairs of spring-loaded conductive jaws, which form the female contacts of the socket assembly. Helper springs are provided to increase the biasing of the jaws. In order to provide a conductive bypass when the meter is removed for servicing or replacement a reciprocable, conductive blade is mounted on a slide mechanism so that it can be wedged between the jaws. The wedging action simultaneously spreads the jaws apart, allowing removal of the meter." See Abstract.

U.S. Pat. No. 7,040,921 (Kellerman), which is incorporated by reference herein in its entirety, allegedly recites that "[t]his invention relates to a socket assembly for a meter box. The socket assembly comprises a plurality of power line connectors for connection to electric power lines of an electric power line system and a meter bypass system. Each power line connector comprises a jaw, a jaw support and first and second sockets. The jaw support comprises a base, a jaw mount having spaced apart flanges and a contact arm. The base, jaw mount and contact arm are formed as a one-piece metal structure to provide a joint-free path for flow of electrical current. The first socket is formed between the jaw and jaw mount for receiving an electrical connector of the electric meter. The second socket is formed between the jaw and contact arm for receiving a slide connector of a bypass system. The slide connector is slidable between a meter operating position and a meter bypass position." See Abstract.

SUMMARY

Certain exemplary embodiments comprise a system, which can comprise a bypass hub for an electrical meter. The bypass hub can comprise an electrically conductive blade comprising a first socket engageable end and a second socket engageable end. The electrically conductive blade can define a through-hole. The electrically conductive blade can be coupled to a shaft via at least one blade retainer.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DEFINITIONS

Figure 1:
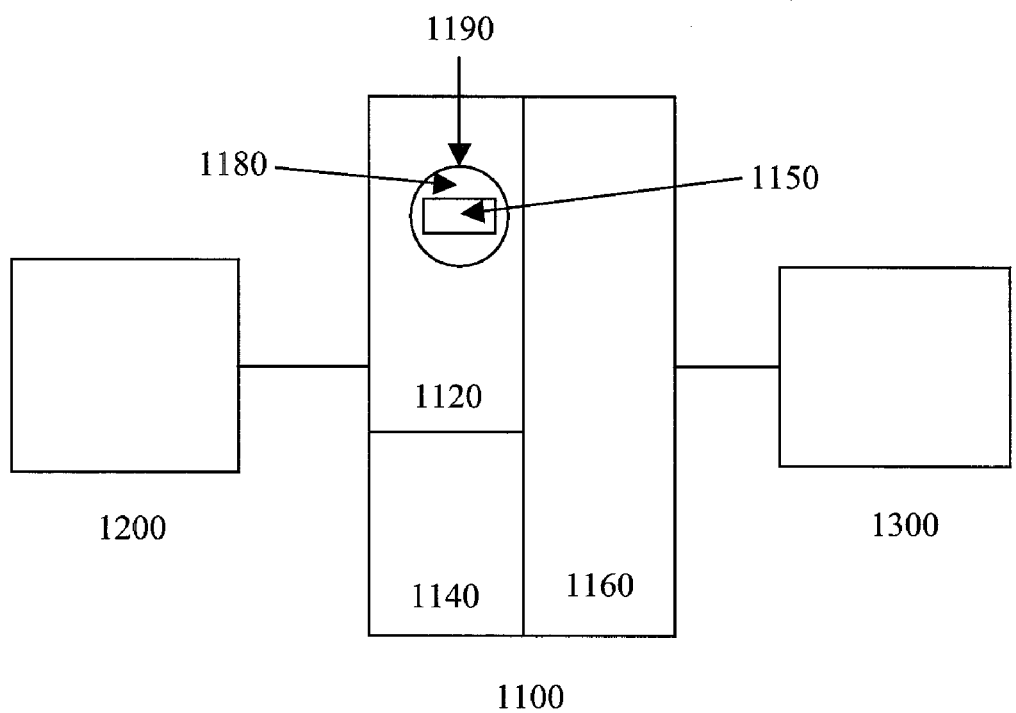
FIG. 1 is a block diagram of an exemplary embodiment of a system 1000.

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.
act—to perform.
activity—an action, act, step, and/or process or portion thereof.
adapted to—made suitable or fit for a specific use or situation.
adapter—a device used to effect operative compatibility between different parts of one or more pieces of an apparatus or system.
air space—a defined gap filled with air.
and/or—either in conjunction with or in alternative to.
aperture—an opening, such as a hole, gap, or slit.
apparatus—an appliance or device for a particular purpose
approximately—nearly the same as.

associate—to join, connect together, and/or relate.
associated with—related to.
attach—to fasten, secure, couple, and/or join.
attachable—capable of being fastened, secured, coupled, and/or joined.
below—less than in magnitude.
between—in a separating interval.
blade—an arm of a rotateable mechanism.
bypass hub—a device adapted to electrically bypass an electrical meter.
can—is capable of, in at least some embodiments.
cause—to produce an effect.
change—to correct to a more desired value.
circuit—an electrically conducting pathway.
circuit breaker—a device adapted to automatically open an alternating current electrical circuit.
combine—to bring together and to create substantial contact therebetween, e.g., to deformably releasably intersect, interleave, merge, collide, interface, and/or otherwise join.
compliant—in accord with one or more standards.
comprising—including but not limited to.
conductive—adapted to transmit.
configure—to make suitable or fit for a specific use or situation.
configured to—capable of performing a particular function.
connect—to join or fasten together.
convert—to transform, adapt, and/or change.
correct—to change to a more desired value.
couple—to join, connect, and/or link together.
coupleable—capable of being joined, connected, and/or linked together.
create—to bring into being.
crush rib—a protrusion from a first blade retainer, the protrusion adapted to deformably releasably combine with an opposing protrusion of a second blade retainer, the combined protrusions adapted to resist an energizing of a handle passing through the blade retainers.
current—a flow of electrical energy.
de-energize—to remove a supply of an electric current.
define—to establish the outline, form, or structure of.
deform—to alter a shape of something by pressure and/or stress.
device—a machine, manufacture, and/or collection thereof.
dielectric separation—a defined gap with a dielectric material filling at least a portion of the gap.
dielectric properties—resistivity and/or electrical insulating characteristics.
distinct—distinguishable from others.
electrical—pertaining to electricity.
electrically coupled—connected in a manner adapted to transfer electrical energy.
electrical meter—a device adapted to measure a quantity of electrical energy flowing through an electrical system.
electrical panel—a housing adapted to contain electrical components, such as a circuit interrupter, meter, and/or circuit breaker, adapted to manage electrical energy to an electrical device and/or in a circuit.
eliminate—to remove.
end—a terminus of something.
energize—to supply with an electric current.
energy—usable power.
energy source—a system adapted to provide usable power to an energy user.
engage—to interlock or mesh.
handle—a part that is adapted to actuate a device.
install—to connect or set in position and prepare for use.
insulator—a device adapted to resist a flow of electrical energy.
length—a measurement of an extent of something along a greatest dimension.
magnitude—greatness in size or extent.
maintain—to keep in a particular condition.
manage—to direct or control.
may—is allowed and/or permitted to, in at least some embodiments.
method—a process, procedure, and/or collection of related activities for accomplishing something.
motion—changing position or place.
move—to change in position from a first location to a second location.
obtain—to receive, calculate, determine, and/or compute.
occur—to take place.
partially—to an extent, but not necessarily totally.
pass—to go through.
plurality—the state of being plural and/or more than one.
position—(n) a place and/or location, often relative to a reference point. (v) to place and/or locate.
predetermined—established in advance.
prevent—to keep an event from happening.
produce—to manufacture or make.
project—to calculate, estimate, or predict.
prong—a projecting part, such as a protrusion, bar, stub, rod, pin, cylinder, etc.
protrusion—something that projects from an object.
provide—to furnish, supply, give, and/or make available.
receive—to take, get, acquire, and/or have bestowed upon.
receiver—a recessed part or socket adapted to receive a corresponding prong.
recess—a chamber or cavity adapted to receive a corresponding protrusion.
relative—in comparison with.
releasably—capable of being freed, in a substantially non-destructive manner, from something that binds, fastens, or holds back.
resist—to act in opposition to.
restrain—to limit and/or restrict.
retainer—a device adapted to restrain motion of a retained device in at least one direction.
rotate—to turn around on an axis.
secure—to make firm or tight; fasten.
select—to make a choice or selection from alternatives.
set—a related plurality.
similar—related in appearance.
single—one item.
single-flip symmetrical snap lock—a securing system comprising two pairs of snapably interlockable notches. In certain embodiments, when interlocked, and when viewing a cross-section cut perpendicularly to faces of the notches, one pair of notches is symmetrical when considered as flipped across a single fold line (i.e., a mirror image) to the other pair. Thus, when interlocked, the cross-sectional view has a single axis of symmetry or line of reflection.
snapably—to be able to open, close, and/or fit together with a click.
socket—an opening or a cavity into which an inserted part is designed to fit.
standard—one or more settled criterion.
substantially—to a great extent or degree.

support—to bear the weight of, especially from below.

system—a collection of mechanisms, devices, data, and/or instructions, the collection designed to perform one or more specific functions.

tool—a device adapted to perform or facilitate mechanical work.

therebetween—in a defined intermediate space.

thereto—to that.

through—in one side and out an opposing side of.

through-hole—an aperture defining substantially constant cross sectional shape along a longitudinal axis of each aperture.

user—any person, process, device, program, protocol, and/or system that uses a device.

utilize—to put to use.

via—by way of and/or utilizing.

width—a measurement of an extent of something from a first side to a second side.

DETAILED DESCRIPTION

Certain exemplary embodiments provide a system, which can comprise a bypass hub for an electrical meter. The bypass hub can comprise an electrically conductive blade comprising a first socket engageable end and a second socket engageable end. The electrically conductive blade can define a through-hole. The electrically conductive blade can be coupled to a shaft via at least one blade retainer.

In certain exemplary embodiments, a hub assembly can comprise two substantially similar hub halves, which can be called blade retainers. The blade retainers can be snapably coupleable, which can make manufacturing of an electrical meter bypass hub assembly relatively simple. A two piece snap-fit assembly can provide for relatively good assembly control and might be preferred as compared to insert molding. Snapable fasteners can be adapted to resist a separation of the blade retainers once they have been coupled. Certain exemplary embodiments can comprise a single-flip symmetrical snap lock, which can provide relatively good retention strength and ease of assembly. Certain exemplary embodiments can comprise internal interlocking ribs on the hub assembly, which can adapt a hub assembly to be releasable and/or reusable while maintaining a dielectric spacing and reinforcement during engagement of a handle coupled to the hub.

FIG. 1 is a block diagram of an exemplary embodiment of a system 1000, which can comprise an electrical panel 1100. Electrical panel 1100 can comprise an electrical meter socket 1150, which can be protected by an electrical meter cover 1190. Electrical meter socket 1150 can be releasably coupled to electrical panel 1100 via an electrical meter bypass system or electrical meter 1180. Electrical meter socket 1150 can be adapted to be electrically coupled to an energy source 1200 via a bypass hub or electrical meter 1180. Electrical panel 1100 can comprise one or more predetermined locations adapted to receive electrical meter socket 1150. Electrical panel 1100 can be adapted to receive electrical meter 1180, which can be electrically coupled to the electrical meter socket 1150 to measure a flow of electrical energy to an electrical load 1300. Electrical panel 1100 can alternatively be configured for the bypass hub to be electrically coupled to electrical meter socket 1150 in order to provide an uninterrupted flow of electrical energy to an electrical load 1300 if the electrical meter 1180 is removed. Electrical panel 1100 can comprise a plurality of panel covers 1120, 1140, and 1160, each of which can restrict access to installed components comprised by electrical panel 1100.

Electrical panel 1100 can be electrically coupled to electrical energy source 1200. Electrical energy source 1200 can be an electrical power plant, electrical substation, electrical switch gear, and/or electrical transformer, etc. Electrical panel 1100 can be electrically coupled to an electrical load 1300. Electrical load 1300 can comprise one or more components associated with a home, factory, industrial plant, commercial building, store, events facility, governmental building construction site, and/or theme park, etc.

Figure 2:
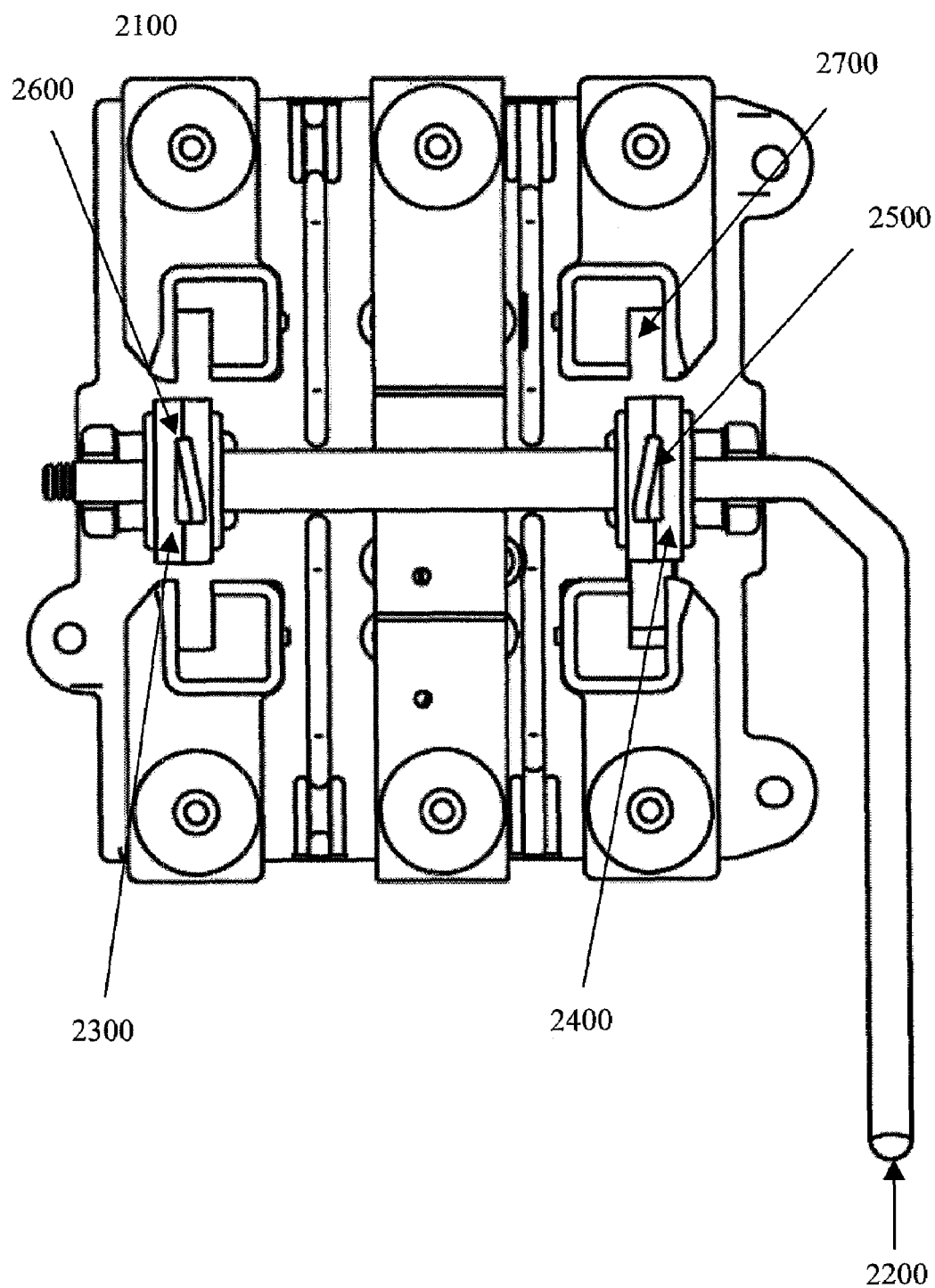
FIG. 2 is a block diagram of an exemplary embodiment of a system 2000.

FIG. 2 is a block diagram of an exemplary embodiment of a system 2000, which can comprise an electrical meter socket assembly 2100. System 2000 can comprise an electrical meter bypass handle 2200. Electrical meter bypass handle 2200 can be coupled to a first blade retainer 2300 and a second blade retainer 2400. Electrical meter bypass handle 2200 can be adapted to be releasably coupled to first blade retainer 2300 and second blade retainer 2400. Electrical meter bypass handle 2200 can be adapted to electrically decouple an electrical meter (not illustrated) from system 2000. A first electrically conductive blade 2500 and a second electrically conductive blade 2600 can be adapted, when handle 2200 is rotated approximately ninety degrees from the illustrated positions, to engage a plurality of blade receiving cavities 2700. Via a rotation of first electrically conductive blade 2500 and second electrically conductive blade 2600 into corresponding blade receiving cavities 2700, first electrically conductive blade 2500 and electrically conductive blade 2600 can be adapted to at least partially de-energize an electrical meter (such as electrical meter 1800 of FIG. 1). When rotated into the corresponding plurality of blade receiving cavities 2700, first electrically conductive blade 2500 and second electrically conductive blade 2600 can spread flexible jaws comprised by the plurality of blade receiving cavities 2700, thereby substantially electrically decoupling the electrical meter and/or providing an electrical path that has less electrical resistance than an electrical path comprising the electrical meter.

Figure 3:
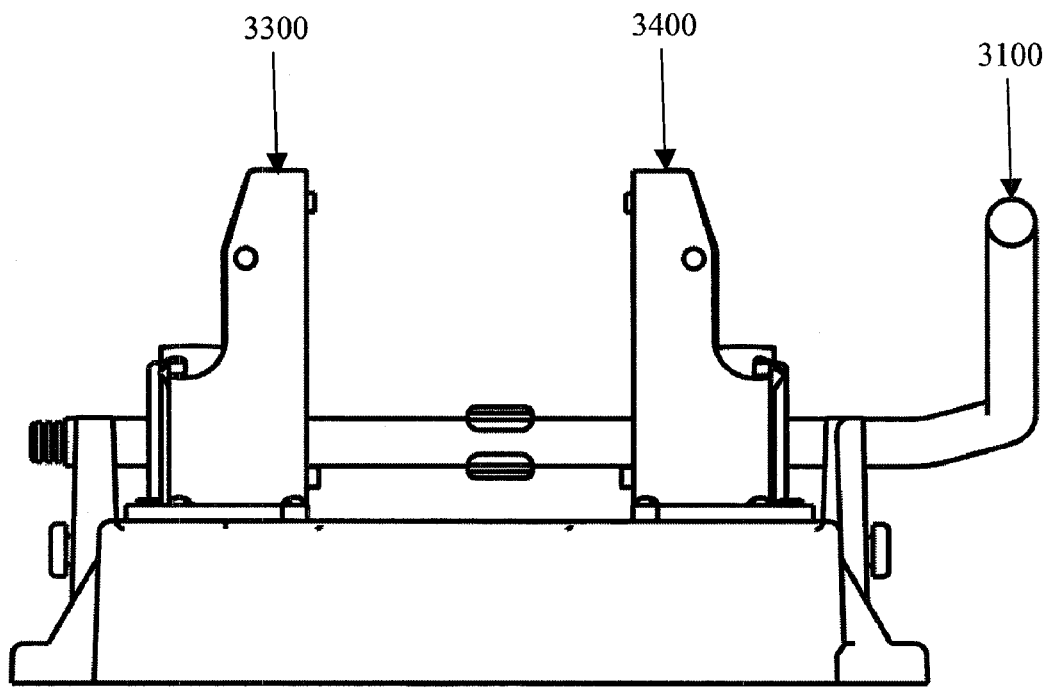
FIG. 3 is a block diagram of an exemplary embodiment of a system 3000.

FIG. 3 is a block diagram of an exemplary embodiment of a system 3000, which can comprise an electrical meter bypass handle 3100. Electrical meter bypass handle 3100 can be coupled to a first blade retainer 3300 and a second blade retainer 3400.

Figure 4:
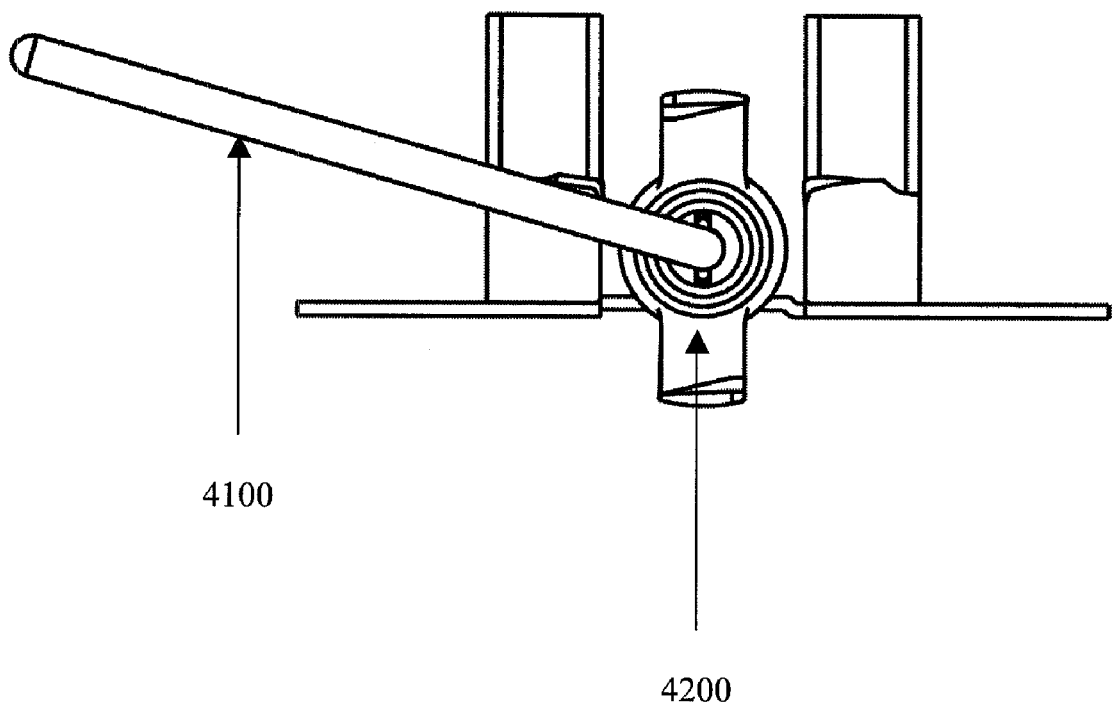
FIG. 4 is a block diagram of an exemplary embodiment of a system 4000.

FIG. 4 is a block diagram of an exemplary embodiment of a system 4000, which can comprise an electrical meter bypass handle 4100. Electrical meter bypass handle 4100 can be coupled to a electrically conductive blade 4200

Figure 5:
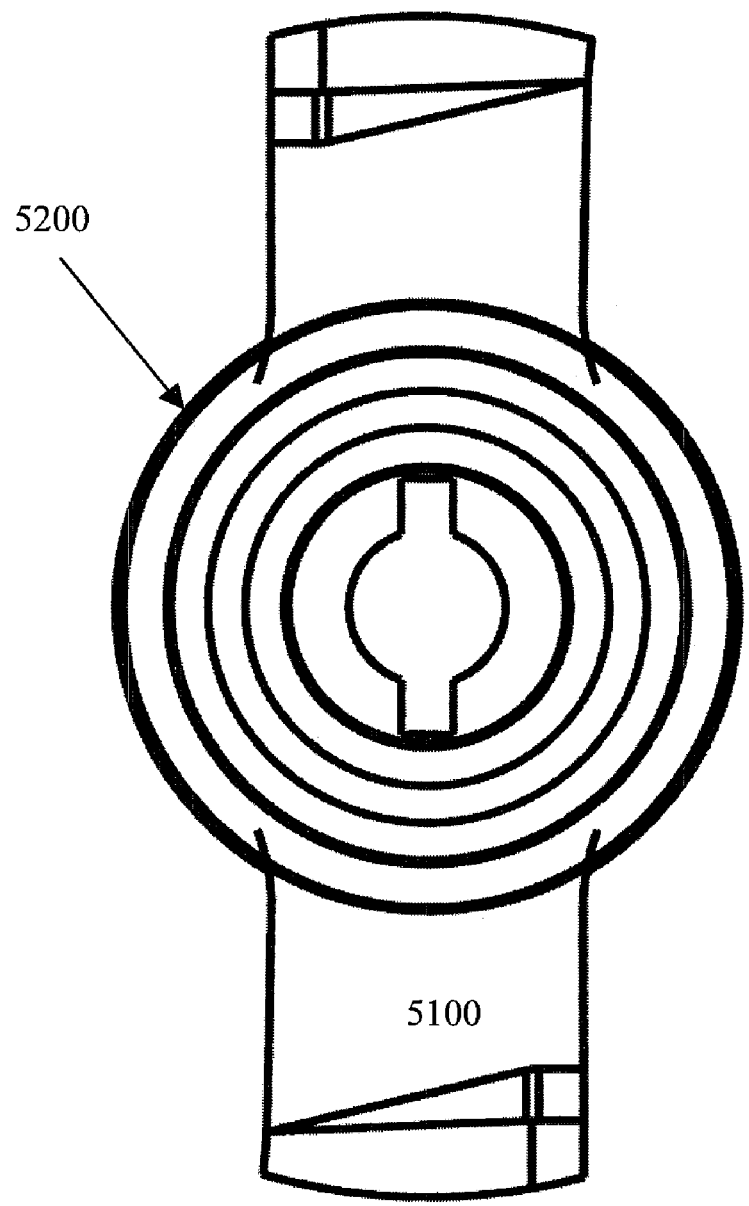
FIG. 5 is a block diagram of an exemplary embodiment of a system 5000.

FIG. 5 is a block diagram of an exemplary embodiment of a system 5000, which can comprise an electrically conductive blade 5100. A blade retainer 5200 can be adapted to be coupled to electrically conductive blade 5100, and can be adapted to couple electrically conductive blade 5100 to an electrical meter bypass handle and/or shaft.

Figure 6:
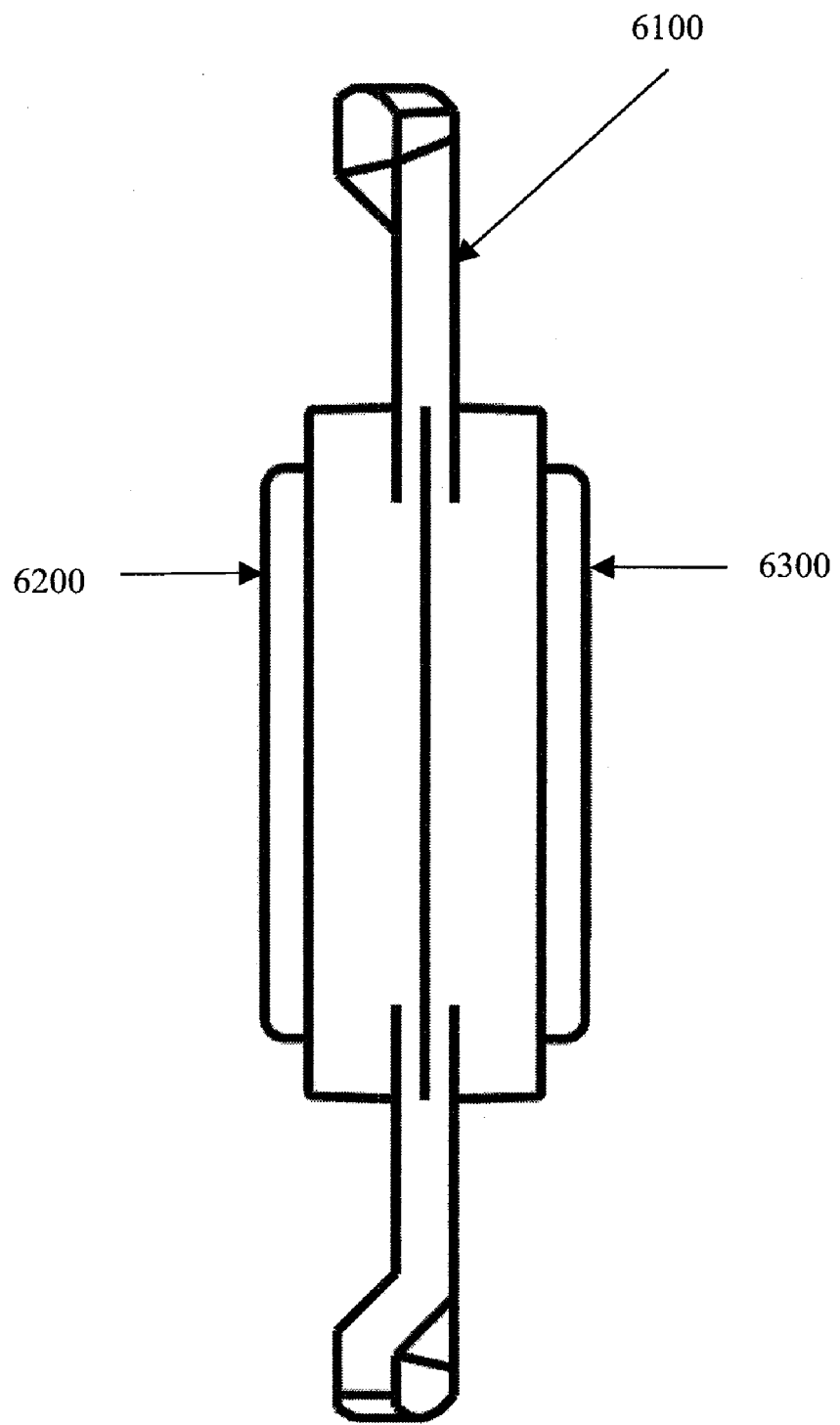
FIG. 6 is a block diagram of an exemplary embodiment of a system 6000.

FIG. 6 is a block diagram of an exemplary embodiment of a system 6000, which can comprise an electrically conductive blade 6100. A first blade retainer 6200 and a second blade retainer 6300 can be adapted to be coupled to electrically conductive blade 6100, and can be adapted to couple electrically conductive blade 6100 to an electrical meter bypass handle. In certain exemplary embodiments, when snapably coupled via a through-hole of electrically conductive blade 6100 (such as through-hole 14100 of FIG. 14), with electrically conductive blade 6100 therebetween, first blade retainer 6200 and second blade retainer 6300 can be adapted to restrain motion of electrically conductive blade 6100 relative to first blade retainer 6200 and second blade retainer 6300.

Figure 7:
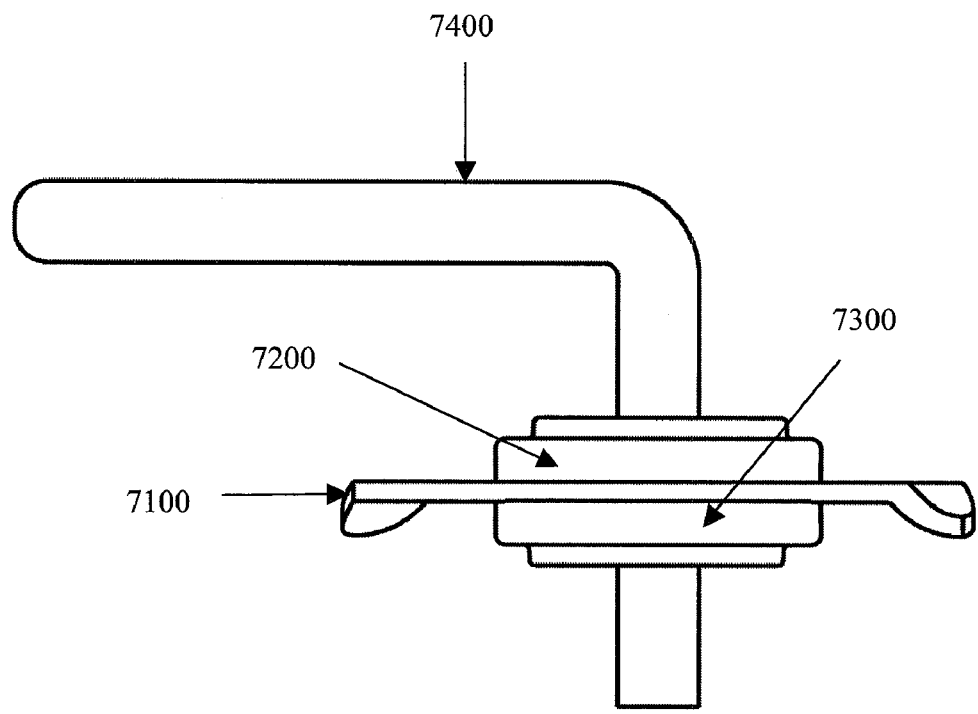
FIG. 7 is a block diagram of an exemplary embodiment of a system 7000.

FIG. 7 is a block diagram of an exemplary embodiment of a system 7000, which can comprise an electrically conductive blade 7100. A first blade retainer 7200 and a second blade retainer 7300 can be adapted to be coupled to electrically conductive blade 7100, and can be adapted to mechanically couple electrically conductive blade 7100 to an electrical meter bypass handle 7400.

Figure 8:
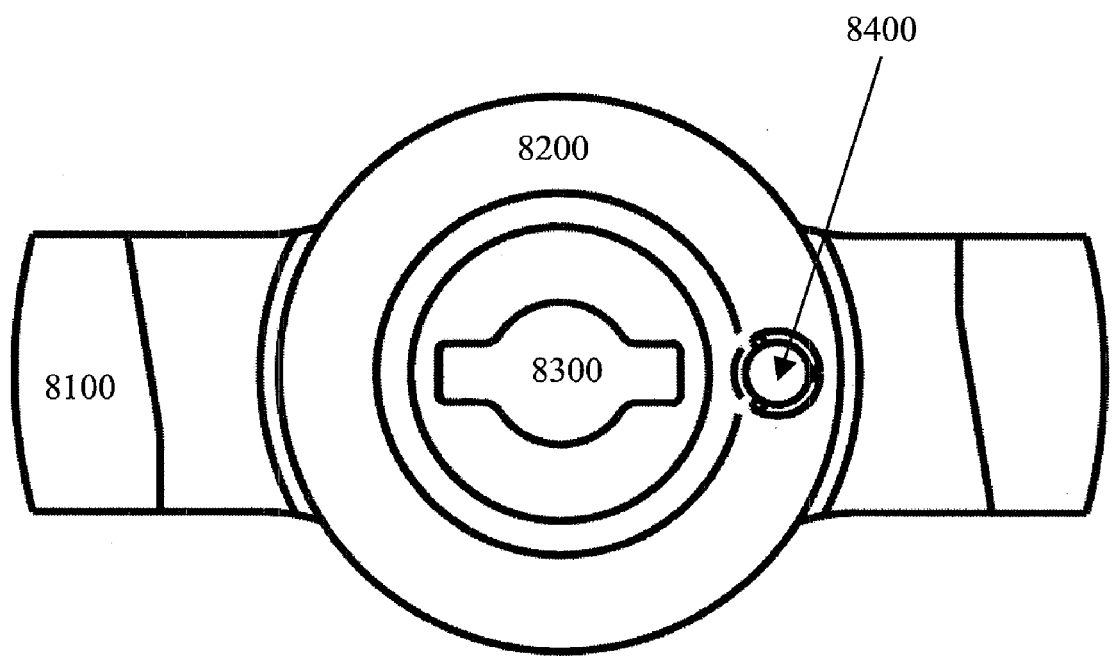
FIG. 8 is a block diagram of an exemplary embodiment of a system 8000.

FIG. 8 is a block diagram of an exemplary embodiment of a system 8000, which can comprise an electrically conductive blade 8100. A blade retainer 8200 can be adapted to be coupled to electrically conductive blade 8100, and can be adapted to mechanically couple electrically conductive blade 8100 to an electrical meter bypass handle and/or shaft. Blade retainer 8200 can define a through-hole 8300, which can be adapted to receive the electrical meter bypass handle. Blade retainer 8200 can comprise a snap 8400, which can be adapted to snapably couple blade retainer 8200 to a second blade retainer (not illustrated).

Figure 9:
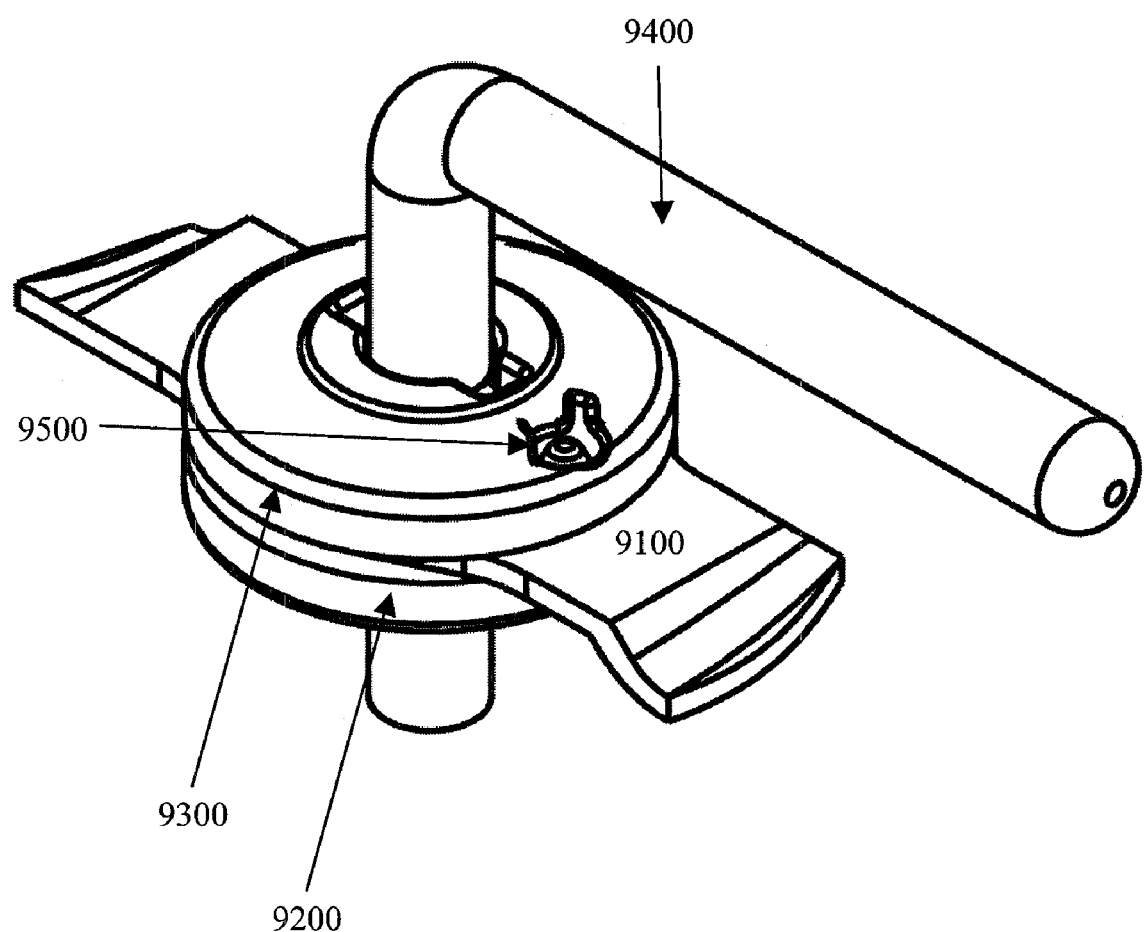
FIG. 9 is a block diagram of an exemplary embodiment of a system 9000.

FIG. 9 is a block diagram of an exemplary embodiment of a system 9000, which can comprise an electrically conductive blade 9100. A first blade retainer 9200 and a second blade retainer 9300 can be adapted to be coupled to electrically conductive blade 9100, and can be adapted to couple electrically conductive blade 9100 to an electrical meter bypass handle 9400. First blade retainer 9200 can be snapably coupled to second blade retainer 9300 via a snapable fastener set 9500. In certain exemplary embodiments, first blade retainer 9200 and second blade retainer 9300 can be adapted to act as an electrical insulator between electrically conductive blade 9100 and handle 9400, which can be mechanically coupleable thereto. In certain exemplary embodiments, snapable fastener set 9500 can be releasable via a tool once first blade retainer 9200 and second blade retainer 9300 are snapably coupled. In certain exemplary embodiments, snapable fastener set 9500 can be releasable without a tool once first blade retainer 9200 and second blade retainer 9300 are snapably coupled.

Figure 10:
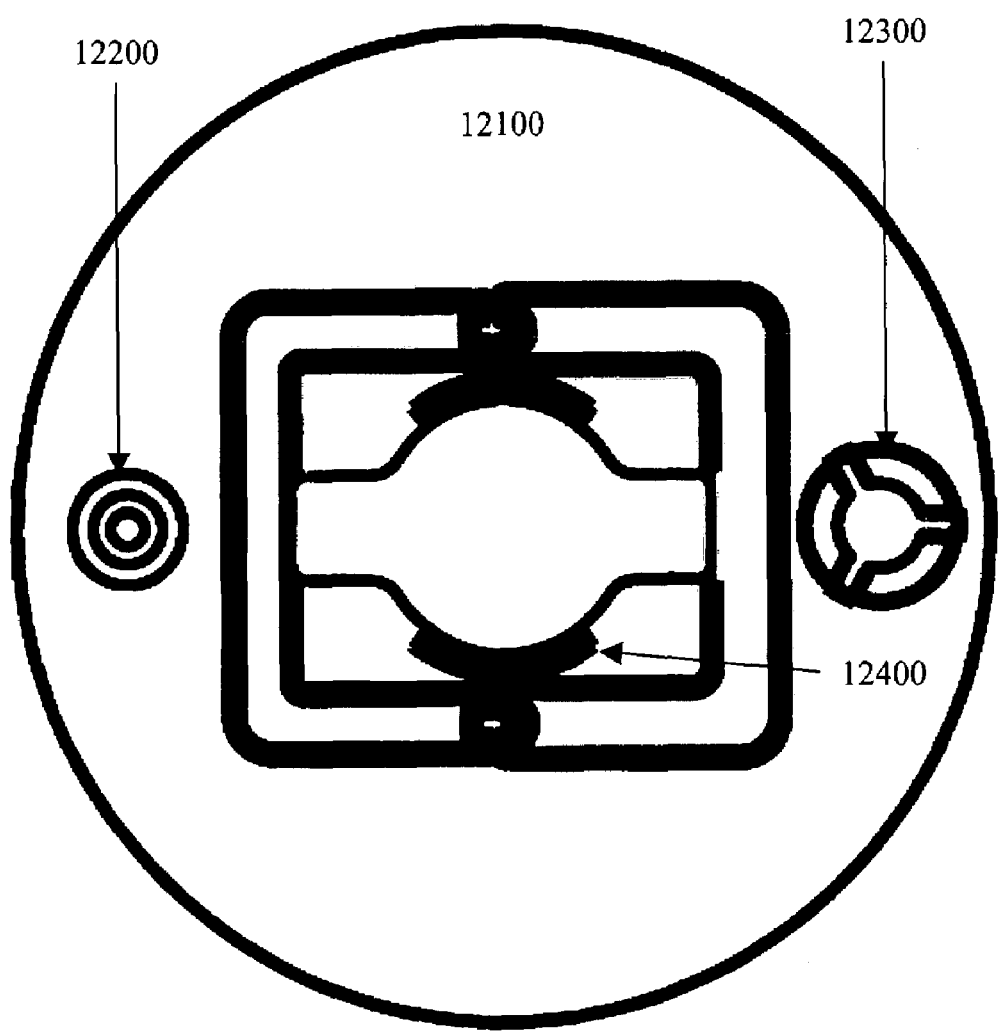
FIG. 10 is a block diagram of an exemplary embodiment of a system 12000.

FIG. 10 is a block diagram of an exemplary embodiment of a system 12000, which can comprise a blade retainer 12100. Blade retainer 12100 can be an exemplary embodiment of first blade retainer 9200 and/or second blade retainer 9300 of FIG. 9. Blade retainer 12100 can comprise a distinct prong 12200 and a distinct receiver 12300. Prong 12200 can be adapted to be snapably coupled to a corresponding receiver of a second blade retainer (not illustrated). Receiver 12300 can be adapted to be snapably coupled to a corresponding prong of the second blade retainer (not illustrated). Blade retainer 12100 can comprise a crush rib 12400. Crush rib 12400 can be adapted to electrically isolate an electrically conductive shaft (not illustrated) from an electrically conductive blade (not illustrated). Thereby, crush rib 12400 can resist arcing between the electrically conductive blade and the electrically conductive shaft.

Figure 11:
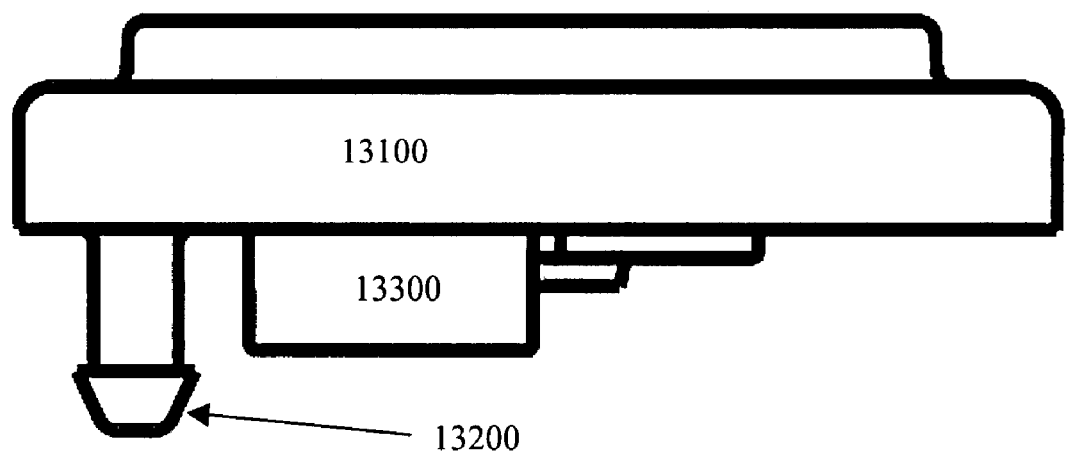
FIG. 11 is a block diagram of an exemplary embodiment of a system 13000.

FIG. 11 is a block diagram of an exemplary embodiment of a system 13000, which can comprise a blade retainer 13100. Blade retainer 13100 can comprise a prong 13200, which can be adapted to be snapably coupled to a corresponding receiver of a second blade retainer (not illustrated). Blade retainer 13100 can define a protrusion 13300, which can be received by a corresponding recess of a second blade retainer (not illustrated). Blade retainer 13100 can define a first recess (not illustrated), which can be on an opposing side of blade retainer 13100 as compared to protrusions 13300. When blade retainer 13100 and the second blade retainer are snapably coupled, protrusion 13300 and a second protrusion of the second blade retainer can be adapted to resist motion of blade retainer 13100 relative to the second blade retainer.

Figure 12:
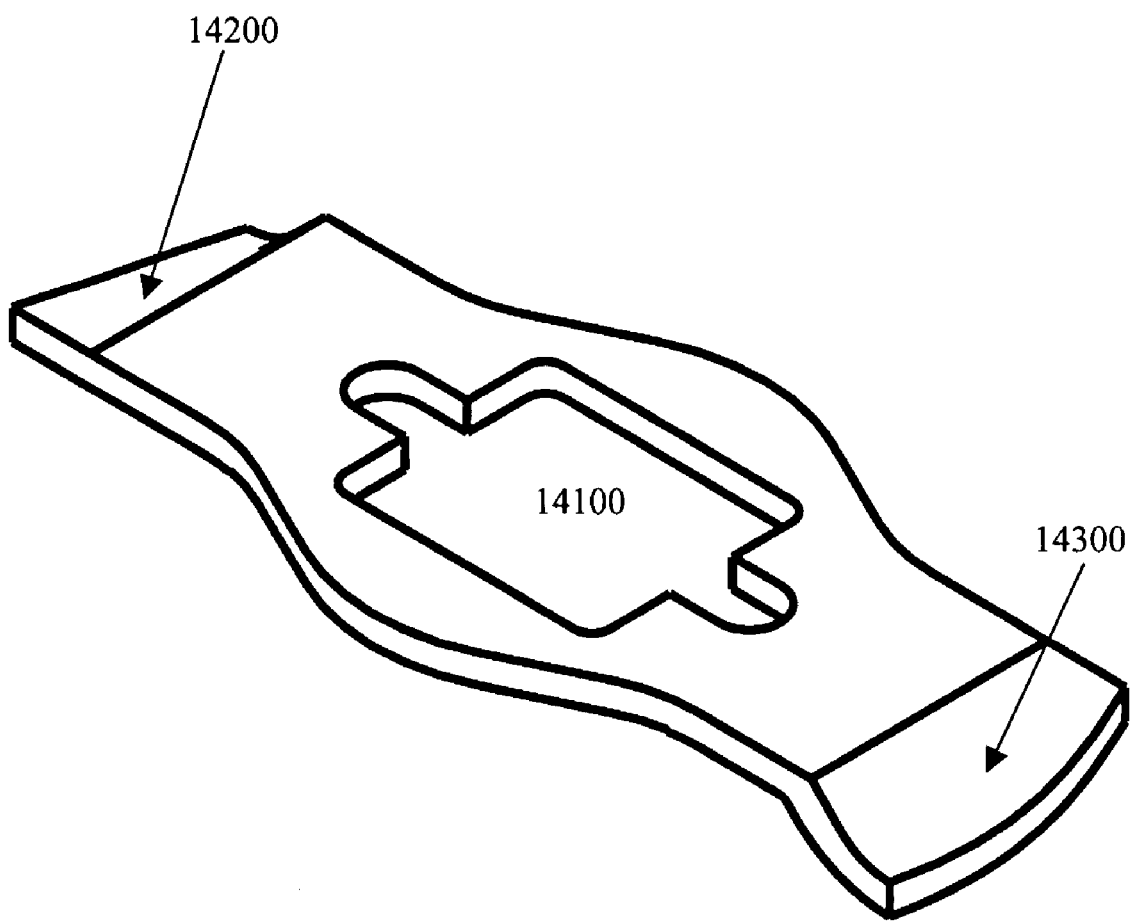
FIG. 12 is a block diagram of an exemplary embodiment of an electrically conductive blade 14000.

FIG. 12 is a block diagram of an exemplary embodiment of an electrically conductive blade 14000, which can define a through-hole 14100. Electrically conductive blade 14000 can comprise a first socket engageable end 14200 and a second socket engageable end 14300.

Figure 13:
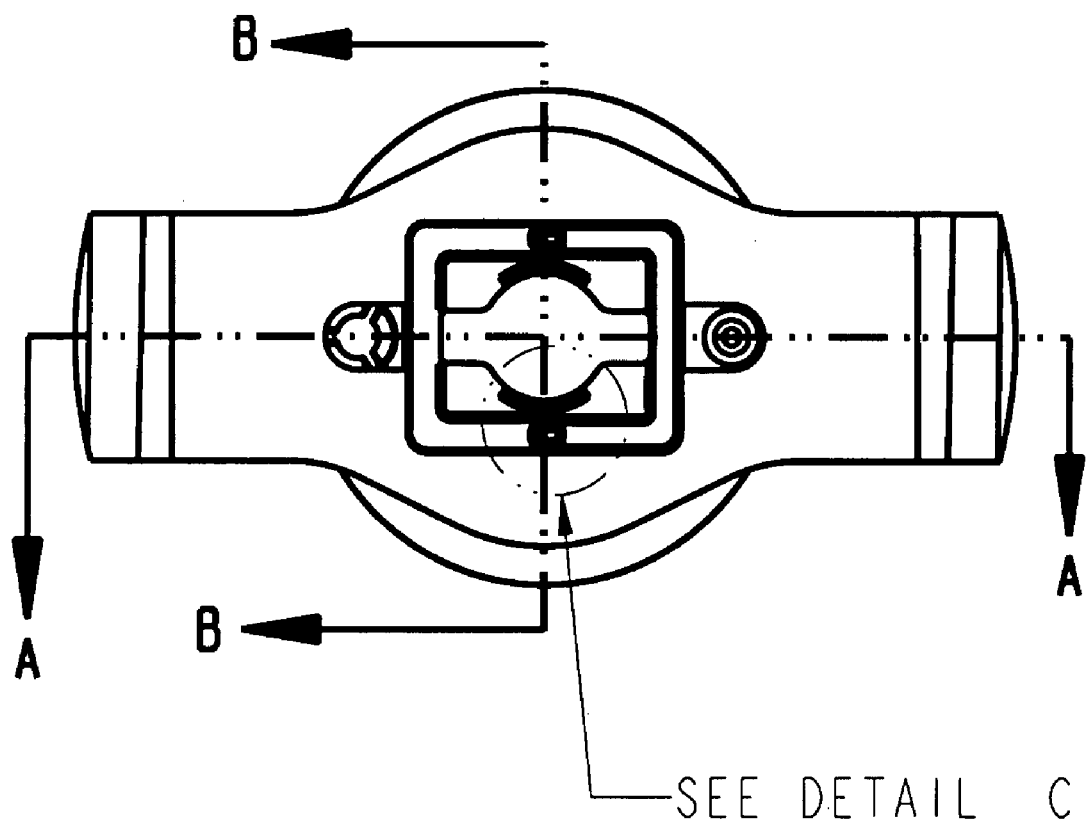
FIG. 13 is a block diagram of an exemplary embodiment of a system 16000.

FIG. 13 is a block diagram of an exemplary embodiment of a system 1600, which can be understood by one skilled in the art, via a section A-A. Section A-A is illustrated in system 17000 of FIG. 14.

Figure 14:
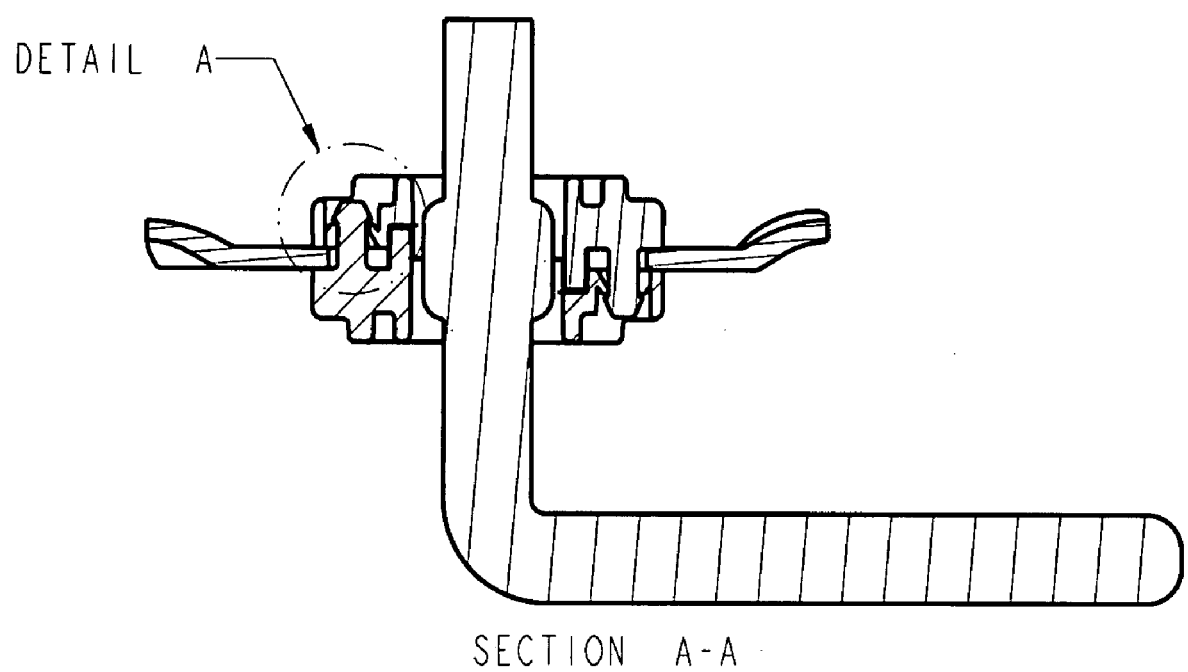
FIG. 14 is a sectional view of a block diagram of an exemplary embodiment of a system 17000.

FIG. 14 is a sectional view of a block diagram of an exemplary embodiment of a system 17000, which can correspond to section A-A of system 16000 of FIG. 13. A location of a detail A is illustrated in 17, which is illustrated as system 18000 of FIG. 15.

Figure 15:
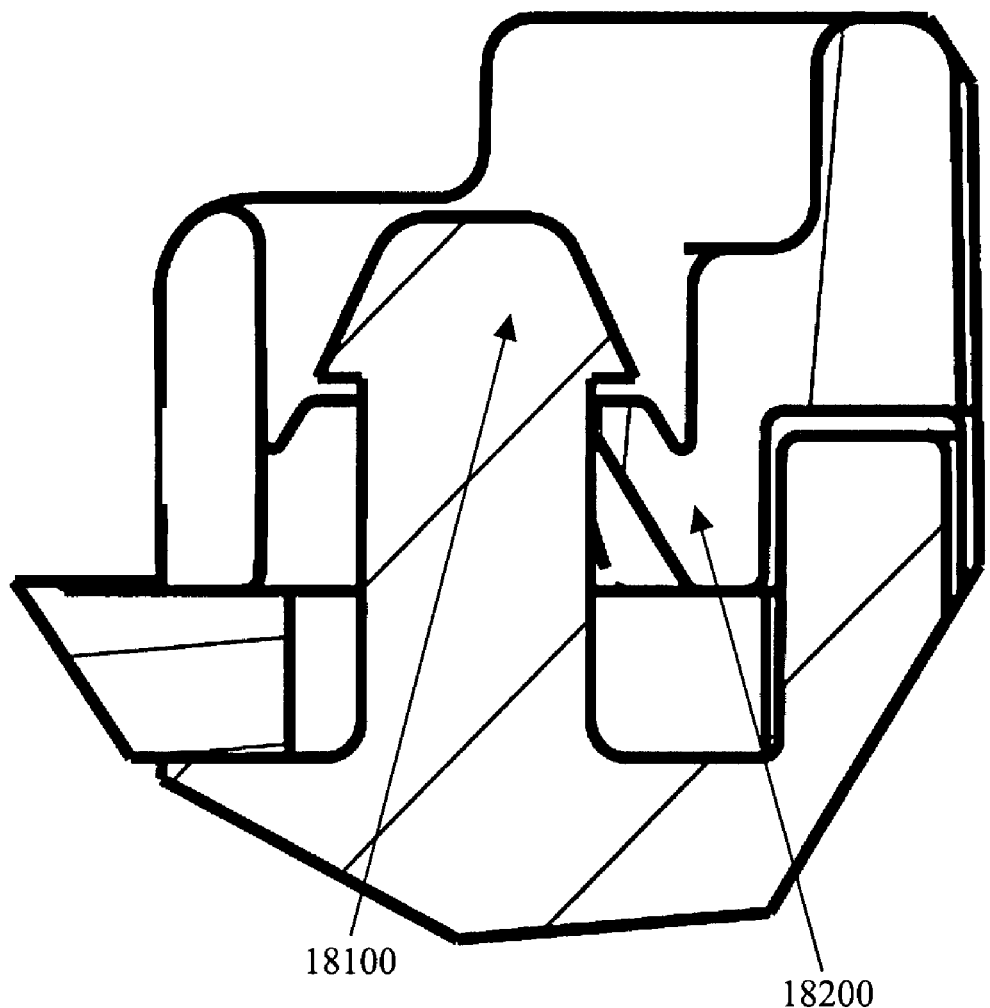
FIG. 15 is a detail view of a block diagram of an exemplary embodiment of a system 18000.

FIG. 15 is a detail view of a block diagram of an exemplary embodiment of a system 18000, which can correspond to detail A of system 17000 of FIG. 14. System 18000 can comprise a prong 18100 of a first blade retainer. System 18000 can comprise a receiver 18200 of a second blade retainer. Prong 18100 and receiver 18200 can form a single-flip symmetrical snap lock when coupled.

Figure 16:
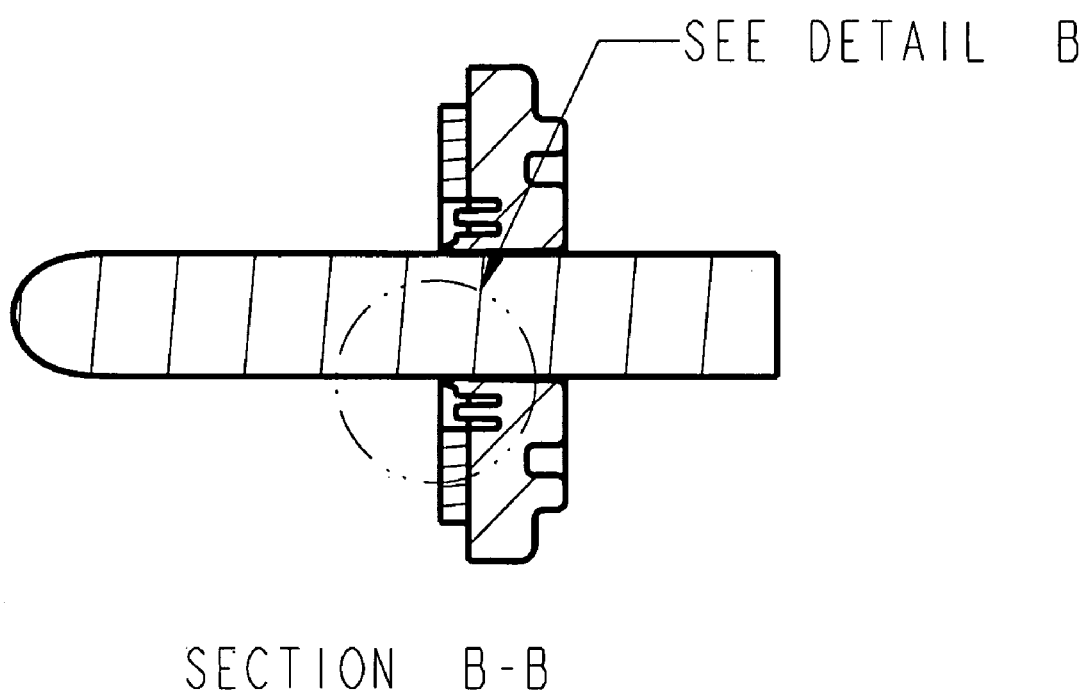
FIG. 16 is a sectional view of a block diagram of an exemplary embodiment of a system 19000.

FIG. 16 is a sectional view of a block diagram of an exemplary embodiment of a system 19000, which can correspond to section B-B of system 16000 of FIG. 16. System 19000 illustrates a location of a detail B, which is illustrated as system 20000 of FIG. 17.

Figure 17:
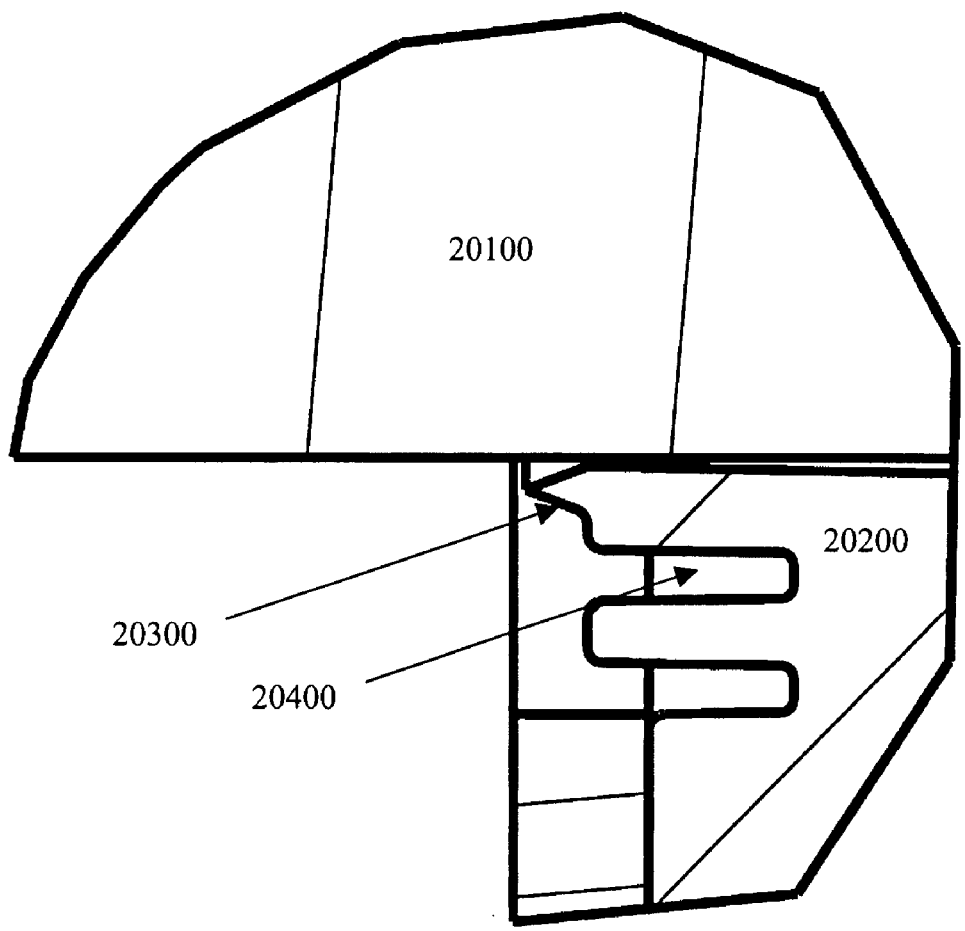
FIG. 17 is a detail view of a block diagram of an exemplary embodiment of a system 20000.

FIG. 17 is a detail view of a block diagram of an exemplary embodiment of a system 20000, which can correspond to detail B of system 19000 of FIG. 16. System 20000 can comprise a handle 20100 and a blade retainer 20200. Blade retainer 20200 can comprise a crush rib 20300. Crush rib 20300 can be adapted to deformably releasably combine, e.g., deformably releasably intersect, interleave, merge, collide, interface, and/or otherwise come in contact with a second crush rib of a second blade retainer (not illustrated). When combined, crush rib 20300 and the second crush rib can substantially eliminate an air space therebetween. When combined, crush rib 20300 and the second crush rib can be adapted to resist an energizing of handle 20100 that passes through a through-hole (such as through-hole 14100 of FIG. 12) defined by an electrically conductive blade (such as electrically conductive blade 14000 of FIG. 12).

When blade retainer 20200 and the second blade retainer are snapably coupled, a bypass hub comprising blade retainer 20200 can be adapted to define at least one air space, such as an air space 20400. Via air space 20400 and/or crush rib 20300, the bypass hub, comprising blade retainer 20200 and the second blade retainer, can be characterized by dielectric properties compliant with a predetermined standard, such as an Underwriters Laboratory standard. Air space 20400 can be maintained between an electrically conductive blade and handle 20100.

Figure 18:
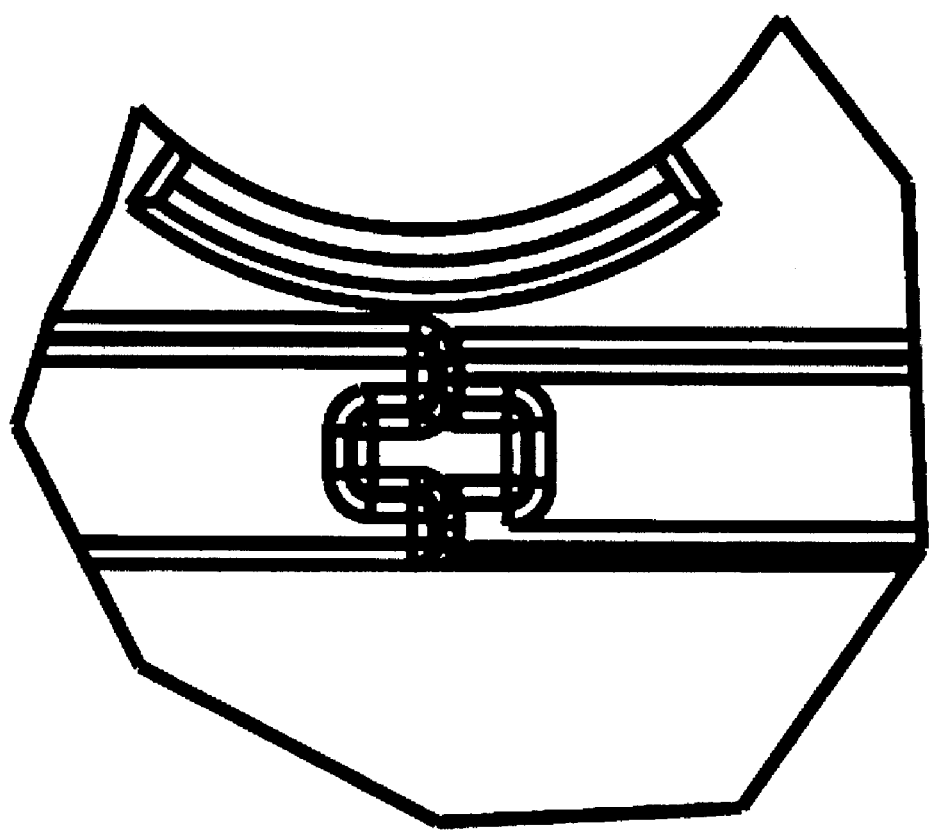
FIG. 18 is a detail view of a block diagram of an exemplary embodiment of a system 21000.

FIG. 18 is a detail view of a block diagram of an exemplary embodiment of a system 21000, which can correspond to detail C of system 16000 of FIG. 13.

Figure 19:
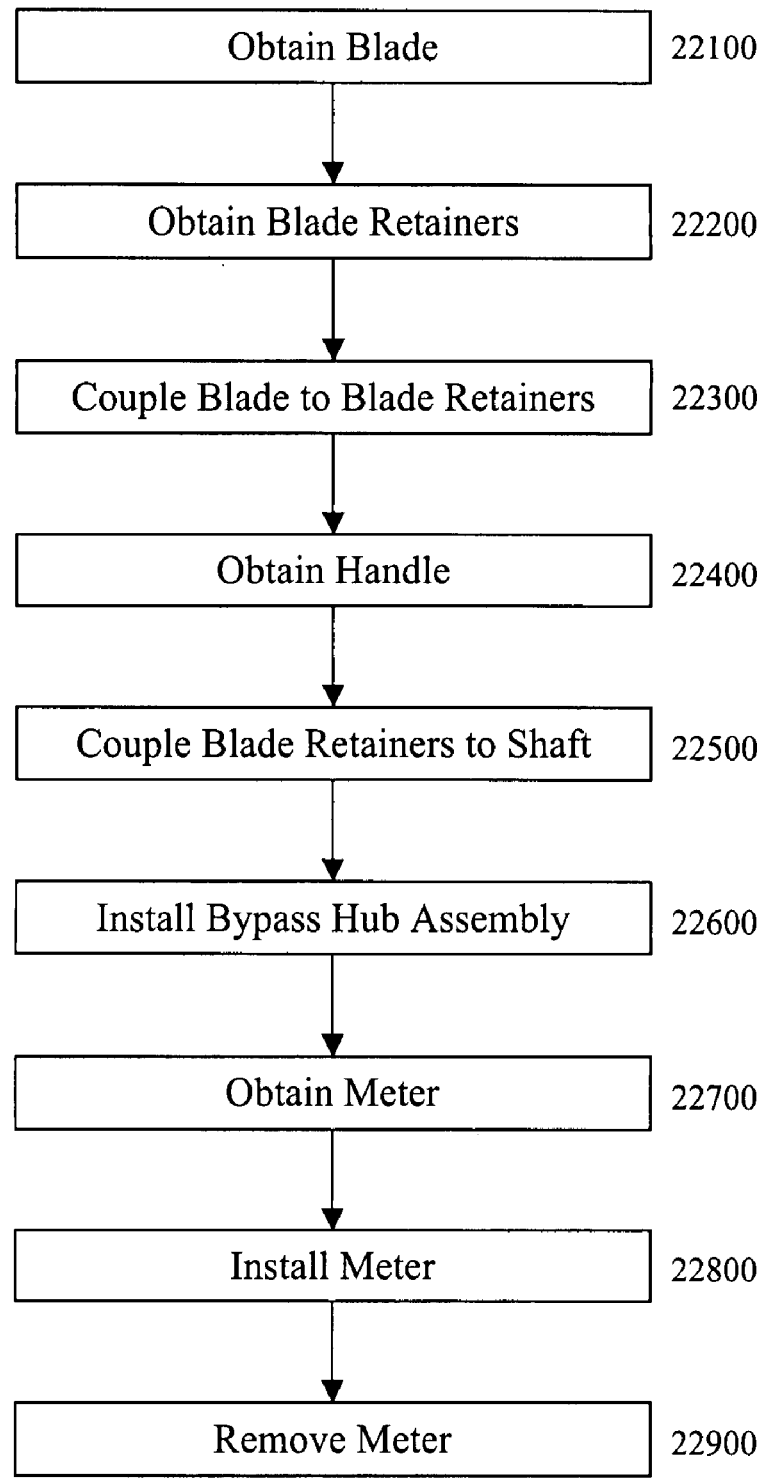
FIG. 19 is a flowchart of an exemplary embodiment of a method 22000.

FIG. 19 is a flowchart of an exemplary embodiment of a method 22000. At activity 22100, an electrically conductive blade can be obtained. The electrically conductive blade can be made of an electrically conductive material such as copper, steel, aluminum, brass, and/or bronze, etc.

At activity 22200, two or more blade retainers can be obtained. The blade retainers can be made and/or fabricated from a relatively electrically non-conductive material such as Teflon, nylon, polyethylene, polypropylene, polyvinyl chloride, and/or polymeric material, etc. In exemplary operative embodiments, the blade retainers can serve as an electrical insulator between the blade and a handle or lever. The handle or lever can be adapted to electrically couple and/or decouple an electrical meter to an energy source associated with a blade retainer system.

At activity 22300, one or more blades can be mechanically coupled to two or more blade retainers. For example, a prong of a first blade retainer can be snapably coupled to a receiver of a second blade retainer. In embodiments wherein the first blade retainer is substantially similar to the second blade retainer, a prong of the second blade retainer can be snapably coupled to a receiver of the first blade retainer. In certain exemplary embodiments, the first blade retainer can define a protrusion and a first recess. The second blade retainer can have a protrusion and a receiver that correspond to those of the first blade retainer. The protrusion of the first blade retainer can engage with the recess of the second blade retainer. The protrusion of the second blade retainer can be adapted to engage with the recess of the first blade retainer.

At activity 22400, a handle can be obtained. The handle can be an electrically conductive handle that comprises steel, aluminum, copper, tin, brass, bronze, and/or stainless steel, etc.

At activity 22500, blade retainer assemblies can be coupled to the shaft.

At activity 22600, the bypass hub assembly can be installed in an electrical panel. In certain exemplary embodiments, the bypass hub assembly can be sufficiently strong to resist damage that might be caused by torque applied to the handle when a user operates the handle. In certain exemplary embodiments, the bypass hub assembly can be sufficiently strong to resist a dielectric breakdown that might be caused by torque applied to the handle when a user operates the handle.

At activity 22700, an electrical meter can be obtained. The electrical meter can be adapted to measure, directly or indirectly, a flow of electrical energy from an electrical energy source to an electrical energy load.

At activity 22800, the electrical meter can be installed in the electrical panel. For example, the electrically meter can be pluggably attached to a plurality of sockets, each of which can comprise a spring-loaded jaw. The plurality of spring loaded jaw sockets can be adapted to mechanically and electrically couple the electrical meter to an electrical panel.

At activity 22900, the electrical meter can be removed from the electrical panel via an engagement of the bypass hub assembly. In certain exemplary embodiments, the electrical meter can be removed without interrupting a flow of electrical energy to a load electrically coupled to an electrical circuit associated with the meter. The electrical meter can be removed by a qualified and/or certified person Note Still other practical and useful embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application.

Thus, regardless of the content of any portion (e.g., title, field, background, summary, abstract, drawing FIGURE, etc.) of this application, unless clearly specified to the contrary, such as via an explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

any elements can be integrated, segregated, and/or duplicated;

any activity can be repeated, performed by multiple entities, and/or performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

Any information in any material (e.g., a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Accordingly, the descriptions and drawings are to be regarded as illustrative in nature, and not as restrictive.

What is claimed is:

1. A system comprising:
   a bypass hub for an electrical meter, said bypass hub comprising:
      an electrically conductive blade comprising a first socket engageable end and a second socket engageable end, said electrically conductive blade defining a through-hole;
   a first blade retainer, said first blade retainer defining:
      a distinct first prong;
      a distinct first receiver; and
      a distinct first crush rib;
   a second blade retainer, said second blade retainer defining:
      a distinct second prong;
      a distinct second receiver; and
      a distinct second crush rib;
   wherein:
      said first receiver is adapted to receive said second prong;
      said second receiver is adapted to receive said first prong; and
      said first blade retainer is snapably coupleable to said second blade retainer.

2. The system of claim 1, further comprising:
   a handle, said handle adapted to be rotateably secured between said first blade retainer and said second blade retainer, wherein said handle is adapted to rotateably couple said electrically conductive blade to an electrical meter.

3. The system of claim 1, further comprising:
an electrical meter adapted to be electrically coupled to an energy source via said bypass hub.

4. The system of claim 1, further comprising:
an electrical panel comprising a socket adapted to receive said bypass hub.

5. The system of claim 1, further comprising:
an electrical panel adapted to receive an electrical meter, said electrical panel configured for said bypass hub to be electrically coupled to said electrical meter.

6. The system of claim 1, wherein said first crush rib is adapted to deformably releasably combine with said second crush rib, thereby substantially eliminating an air space therebetween.

7. The system of claim 1, wherein when deformably releasably combined, said first crush rib and said second crush rib are adapted to resist an energizing of a handle passing through said through-hole.

8. The system of claim 1, wherein when snapably coupled via said through-hole, with said electrically conductive blade therebetween, said first blade retainer and said second blade retainer adapted to restrain motion of said electrically conductive blade relative to said first blade retainer and said second blade retainer.

9. The system of claim 1, wherein said electrically conductive blade is adapted to at least partially de-energize an electrical meter when said electrically conductive blade is rotateably moved to a predetermined position.

10. The system of claim 1, wherein when said first blade retainer and said second blade retainer are snapably coupled, said bypass hub adapted to define at least one air space, said bypass hub characterized by dielectric properties compliant with a predetermined standard.

11. The system of claim 1, wherein said first blade retainer defines a first protrusion and a first recess, said second blade retainer defining a second protrusion and second recess, when said first blade retainer and said second blade retainer are snapably coupled, said first protrusion and said second protrusion adapted to resist motion of said first blade retainer relative to said second blade retainer when said first blade retainer and said second blade retainer are snapably coupled.

12. The system of claim 1, wherein said first prong and said second receiver form a single-flip symmetrical snap lock when coupled.

13. The system of claim 1, wherein said first blade retainer is substantially similar to said second blade retainer.

14. The system of claim 1, wherein said first blade retainer and said second blade retainer are adapted to act as an electrical insulator between said electrically conductive blade and a handle coupleable thereto.

15. The system of claim 1, wherein said first blade retainer and said second blade retainer are adapted to maintain at least one air space between said electrically conductive blade and a handle coupleable thereto.

16. The system of claim 1, wherein said first blade retainer and said second blade retainer are characterized by dielectric properties compliant with a predetermined standard.

17. The system of claim 1, wherein said first blade retainer is releasably attachable to said second blade retainer.

18. The system of claim 1, wherein said first blade retainer is releasable via a tool once snapably coupled with said second blade retainer.

19. A device comprising:
an electrically conductive blade, said electrically conductive blade defining a through-hole;
a first blade retainer, said first blade retainer defining:
a distinct first prong;
a distinct first receiver; and
a distinct first crush rib;
a second blade retainer, said second blade retainer defining:
a distinct second prong;
a distinct second receiver; and
a distinct second crush rib;
wherein:
said second prong is adapted to be received by said first receiver;
said second receiver is adapted to receive said first prong; and
said second blade retainer is snapably coupleable to said first blade retainer.

20. A method comprising a plurality of activities, comprising:
installing a bypass hub for an electrical meter, said bypass hub comprising:
an electrically conductive blade comprising a first socket engageable end and a second socket engageable end, said electrically conductive blade defining a through-hole;
a first blade retainer, said first blade retainer defining:
a distinct first prong;
a distinct first receiver; and
a distinct first crush rib;
a second blade retainer, said second blade retainer defining:
a distinct second prong;
a distinct second receiver; and
a distinct second crush rib;
wherein:
said second prong is adapted to be received by said first receiver;
said second receiver is adapted to receive said first prong; and
said second blade retainer is snapably coupleable to said first blade retainer.

* * * * *